United States Patent
Schrameyer

(10) Patent No.: US 8,864,202 B1
(45) Date of Patent: Oct. 21, 2014

(54) SPRING RETAINED END EFFECTOR CONTACT PAD

(71) Applicant: Varian Semiconductor Equipment Associates, Inc., Gloucester, MA (US)

(72) Inventor: Michael A. Schrameyer, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 54 days.

(21) Appl. No.: 13/861,737

(22) Filed: Apr. 12, 2013

(51) Int. Cl.
*B25J 15/00* (2006.01)
*B65G 49/07* (2006.01)

(52) U.S. Cl.
CPC .......... *B25J 15/0014* (2013.01); *Y10S 294/902* (2013.01); *Y10S 414/141* (2013.01)
USPC ............................. 294/213; 294/902; 414/941

(58) Field of Classification Search
USPC ............ 294/213, 103.1, 106, 902, 907; 414/736, 941, 222.01; 118/728, 715; 156/345.14; 901/31, 39
See application file for complete search history.

(56) References Cited

U.S. PATENT DOCUMENTS

| | | | | |
|---|---|---|---|---|
| 3,913,646 A | * | 10/1975 | Grayson | 81/44 |
| 5,783,834 A | * | 7/1998 | Shatas | 901/47 |
| 6,116,848 A | * | 9/2000 | Thomas et al. | 414/941 |
| 6,216,883 B1 | * | 4/2001 | Kobayashi et al. | 211/41.18 |
| 6,962,477 B2 | * | 11/2005 | Tateyama et al. | 414/941 |
| 7,055,875 B2 | * | 6/2006 | Bonora et al. | 294/213 |
| 7,384,083 B2 | * | 6/2008 | Kent | 294/213 |
| 7,654,596 B2 | * | 2/2010 | Mantz | 294/213 |
| 7,748,760 B2 | * | 7/2010 | Kushida et al. | 294/213 |
| 8,454,068 B2 | * | 6/2013 | Hashimoto et al. | 294/213 |
| 8,752,872 B2 | * | 6/2014 | Kent | 414/941 |
| 8,764,085 B2 | * | 7/2014 | Urabe et al. | 294/213 |
| 2006/0113806 A1 | * | 6/2006 | Tsuji et al. | 294/1.1 |
| 2007/0128008 A1 | * | 6/2007 | Morikawa | 414/217 |
| 2012/0315113 A1 | * | 12/2012 | Hiroki | 414/217 |

FOREIGN PATENT DOCUMENTS

WO          93/22585 A1          11/1993

* cited by examiner

*Primary Examiner* — Paul T Chin

(57) ABSTRACT

An end effector is disclosed for use in substrate processing. The end effector includes a effector body portion, a contact pad pocket formed in the end effector body, a spring retaining pocket formed in the end effector body adjacent the contact pad pocket and extending to an edge of the end effector body, and a pair of through-holes extending from the spring retaining pocket to the contact pad pocket. The end effector can include a contact pad seated within the contact pad pocket, the contact pad having at least one retaining channel formed therein, and a retaining spring having a pair of retaining arms extending from the retaining spring pocket through the through-holes and into the contact pad pocket. The retaining arms may extend at least partially into the at least one retaining channel of the contact pad and may thereby restrict movement of the contact pad.

20 Claims, 6 Drawing Sheets

SPRING RETAINED END EFFECTOR CONTACT PAD

FIELD OF THE DISCLOSURE

The disclosure relates generally to wear-resistant composite structures, and more particularly to a composite end effector having a retaining spring for removably attaching a removable contact pad to the end effector.

BACKGROUND OF THE DISCLOSURE

During production, substrates are often handled by robotic arms that are equipped with specialized tools, or "end effectors," that are adapted for lifting and moving the substrates. Since substrates can reach high temperatures during processing (e.g., >500° C.), end effectors generally are made from materials that exhibit good thermal stability and wear resistance at high temperatures. Examples of such materials include alumina, zirconia, silicon nitride, silicon carbide, and other ceramics.

Conventional high-temperature end effectors are often made entirely from ceramic. One problem associated with such a construction is that when the substrate-contacting portions of such end effectors become excessively worn or contaminated from use, the entire end effector must be replaced. Such replacement can be expensive as well as wasteful, since the non-material-contacting portions of the end effector may exhibit little or no wear at the time of replacement.

One approach to this problem has been to use composite end effectors, which include substrate-contacting portions that are removably attached to non-material-contacting portions. In some cases, several small contact pads formed of ceramic material are removably attached to the end effector body, which can be made of metal. During use, only the ceramic contact pads contact with hot substrates and thus experience wear over time. When the contact pads become worn or contaminated they are removed and replaced with new contact pads. The end effector body itself needn't be replaced and is thereby preserved.

Although composite end effectors offer several advantages relative to one-piece end effectors, still they have shortcomings. For example, the low thermal expansion and low tensile strength properties of ceramics relative to metals makes it difficult to achieve a secure, rigid connection between the two materials as is required for the construction of a composite end effector. Prior designs have employed threaded connections, press-fit pads, and retaining rings. Each of these fastening arrangements, however, exhibits particular deficiencies. For example, threaded fasteners can impart stresses on ceramic contact pads during thermal cycling, which may result in cracking of the contact pads. Threaded fasteners may also become loose over time due to vibrations and/or thermal cycling. Press-fit pads typically cannot be made from ceramic are difficult to remove when replacement become necessary. Retaining rings that clamp pads to an end effector can generate particles due to relative motion. Such particles can rain down on other silicon wafers which can be detrimental to their quality. Thus, there is a need for an improved design for a replaceable contact pad that overcomes the deficiencies associated with prior designs.

SUMMARY

In view of the foregoing, it would be advantageous to provide a composite end effector having material-contacting portions that are securely attached to a non-material-contacting portion. It would further be advantageous to provide such an end effector wherein the material-contacting portions may be easily removed from the non-material-contacting portion and replaced. It would also be advantageous to provide such an end effector wherein the arrangement for attaching the material-contacting portions to the non-material-contacting portion permits relative thermal expansion and contraction without loosening, and without damaging the end effector. It would further be advantageous to provide such an end effector that mitigates the dispersion of particulate matter.

An exemplary end effector in accordance with the present disclosure may include an end effector body, a contact pad pocket formed in the end effector body, a spring retaining pocket formed in the end effector body adjacent the contact pad pocket and extending to an edge of the end effector body, and a pair of through-holes extending from the spring retaining pocket to the contact pad pocket. The end effector may further include a contact pad seated within the contact pad pocket, the contact pad having at least one retaining channel formed therein, and a retaining spring having a pair of retaining arms extending from the retaining spring pocket through the through-holes and into the contact pad pocket. The retaining arms may extend at least partially into the at least one retaining channel of the contact pad and may thereby restrict movement of the contact pad.

DETAILED DESCRIPTION

Figure 1:
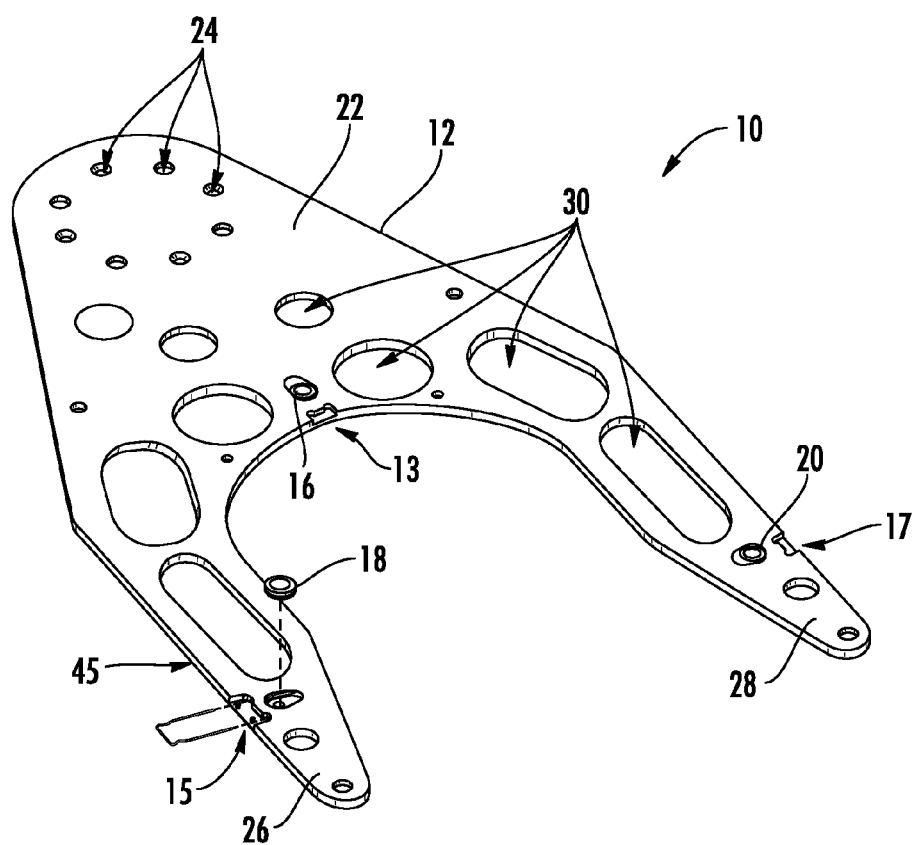
FIG. 1 is a perspective view illustrating an exemplary embodiment of an end effector in accordance with the present disclosure.

An improved composite end effector in accordance with the present disclosure will now be described more fully hereinafter with reference to the accompanying drawings, in which preferred embodiments of the invention are shown. The disclosed end effector, however, may be embodied in many different forms and should not be construed as being limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 illustrates an exemplary embodiment of a composite end effector 10 in accordance with the present disclosure. For the sake of convenience and clarity, terms such as "front," "rear," "top," "bottom," "right," "left," "up," "down," "inwardly," "outwardly," "lateral" and "longitudinal" will be used herein to describe the relative placement and orientation of components of the end effector 10, each with respect to the geometry and orientation of the end effector 10 as it appears in FIG. 1. Said terminology will include the words specifically mentioned, derivatives thereof, and words of similar import.

The exemplary composite end effector 10 disclosed herein is configured for handling a variety of substrates, which in an exemplary embodiment includes silicon wafers. It will be appreciated by those of ordinary skill in the art that this particular configuration is disclosed by way of example only, and that the below-described arrangement for removably coupling the different components of the end effector 10 to one another may be similarly implemented in virtually any type of composite end effector configuration and, more generally, in other types of composite structures in which components that are formed of dissimilar materials must be coupled to one another. All such embodiments are contemplated and may be implemented without departing from the scope of the present disclosure.

The end effector 10 may include a substantially planar, V-shaped end effector body portion 12. The end effector body portion 12 may have a mounting portion 22 having a plurality of apertures 24 formed therethrough for facilitating attachment to a robotic arm, for example. A pair of laterally-spaced lift arms 26 and 28 may extend from the mounting portion 22 and may be adapted for engaging and lifting a substrate. A plurality of cutouts 30 may be formed in the end effector body portion 12 for reducing the overall weight of the end effector 10, but this is not critical. Again, the particular shape and configuration of the end effector body portion 12 is presented by way of example only and may be varied to suit a particular application.

The end effector body portion 12 may be formed of any material that is suitably rigid, durable, and temperature-resistant (i.e., hot and/or cold resistant) for a particular application, such as supporting a hot silicon wafer that is disposed in close proximity to a top surface thereof while the wafer is being supported or moved by the end effector 10. For example, it is contemplated that the end effector body portion 12 may be formed of various metals, plastics, ceramics, or composite materials that exhibit good thermal stability and wear resistance at temperatures below –100° C. and up to and exceeding 500° C.

The end effector 10 may further include a plurality of contact pad regions 13, 15, and 17. As shown, a first contact pad region 13 is disposed in a forward segment of the base portion 22, while second and third contact pad regions 15, 17 are disposed on respective lift arms 26 and 28. As will be appreciated, the positioning of the contact pad regions 13, 15 and 17 is such that contact pads disposed therein can engage and lift a substrate when the end effector 10 is moved. Each contact pad region 13, 15, and 17 may receive respective contact pads 16, 18, and 20 that are removably attached to the end effector body portion 12 as will be further described below. The exemplary end effector 10 includes three contact pad regions 13, 15, and 17, but it will be appreciated that alternative end effector configurations may be implemented that include a greater or fewer number of contact pad installations as may be desired for a particular application. For example, an end effector that is adapted for a "gripping" application (i.e., for grasping workpieces) may include two or more articulating fingers, each of which may have a contact pad installation located on a fingertip thereof.

Figure 2:
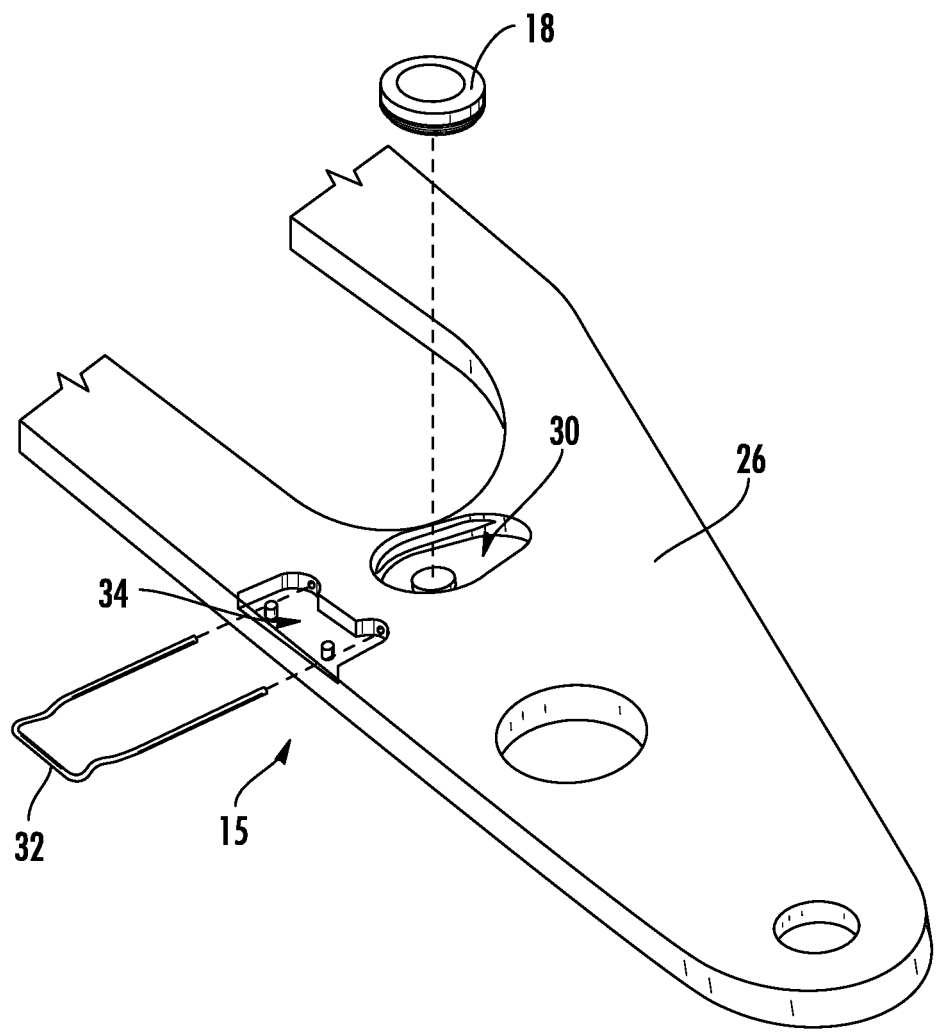
FIG. 2 is an exploded perspective view illustrating a lift arm and a corresponding contact pad installation of the end effector shown in FIG. 1.

FIG. 2 shows the exemplary contact pad region 15 located on the left lift arm 26 of the end effector body portion 12 shown in FIG. 1. The contact pad regions 13 and 17 (shown in FIG. 1) may be substantially the same as the contact pad region 15, and it will therefore be understood that the following description of the contact pad region 15 may apply equally to the contact pad regions 13 and 17.

The contact pad region 15 may include the contact pad 18 (introduced above), a contact pad pocket 30, a retaining spring 32, and a spring pocket 34, each of which will now be described in-turn.

Figure 3:
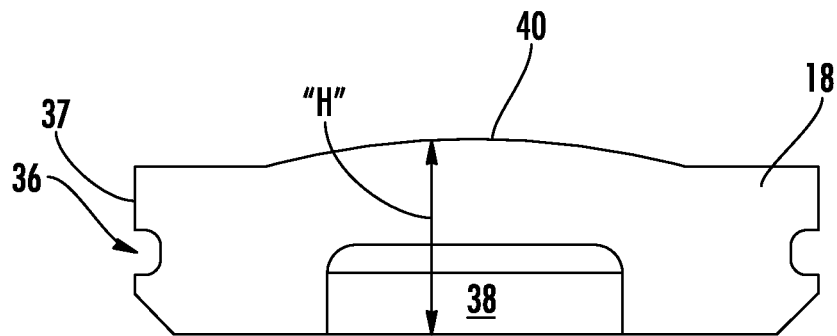
FIG. 3 is a cross-sectional view illustrating an exemplary contact pad for use with the end effector shown in FIG. 1.
Figure 4:
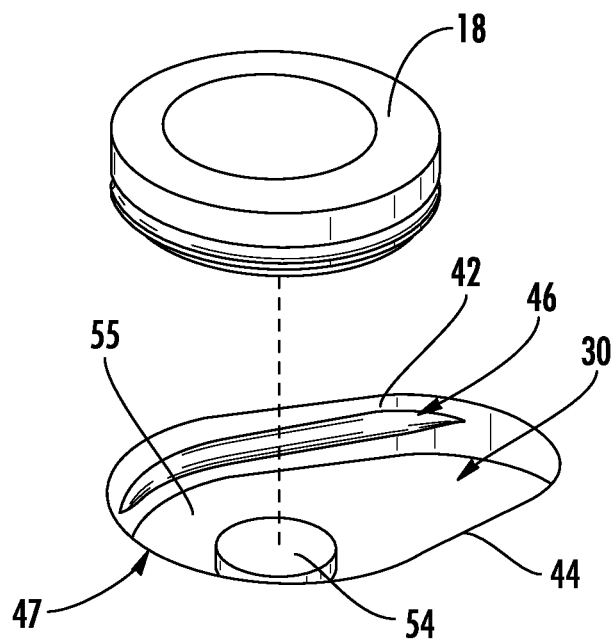
FIG. 4 is an exploded perspective view illustrating the exemplary contact pad of FIG. 3 and a corresponding contact pad pocket of the end effector shown in FIG. 1.

As shown in FIGS. 3 and 4, the contact pad 18 may be a substantially cylindrical member including an annular retaining channel 36 formed in a sidewall 37 thereof, and a locating cavity 38 formed in a bottom portion thereof, the purposes of which will be described below. The contact pad 18 may additionally include a convex, top surface 40 for directly engaging a substrate positioned thereon, but this shape is not critical. In some embodiments the top surface 40 of the contact pad 18 may be flat, peaked (i.e. cone-shaped), irregular, or may feature a plurality of protrusions for engaging a workpiece.

The contact pad 18 is shown as having a circular cross-sectional shape, but it is contemplated that the contact pad 18 may alternatively have a cross-sectional shape that is rectangular, triangular, oval, irregular, etc. It is further contemplated that instead of having a single, annular retaining channel 36, the contact pad 18 may have two separate, diametrically-opposite retaining channels formed in its sidewall 37 as will become apparent below.

As with the end effector body portion 12 (described above), the contact pad 18 may be formed of any material that is suitably rigid, durable, and temperature-resistant for a particular application, such as directly engaging a bottom surface of a hot substrate while the substrate is being supported or moved by the end effector 10. For example, it is contemplated that the contact pad 18 may be formed of various metals, plastics, ceramics, or composite materials that exhibit good thermal stability and wear resistance at temperatures below 100° C. and up to and exceeding 500° C. In one exemplary embodiment the contact pad 18 is made from a ceramic material.

Referring to FIG. 4, the contact pad pocket 30 may be a cavity formed in the top surface of the left lift arm 26. The contact pad pocket 30 may have a tapered-oblong shape defined by opposing sidewalls 42 and 44 that converge as they extend away from an outer edge 45 (FIG. 1) of the left lift arm 26. The rounded end 47 of the contact pad pocket 30 nearest the outer edge 45 of the left lift arm 26 (hereinafter referred to as "the proximal end") may have a radius that is slightly greater than the radius of the contact pad 18, and may have a depth "D" (FIG. 8) that is less than the total height "H" (FIG. 3) of the contact pad 18.

Figure 8:
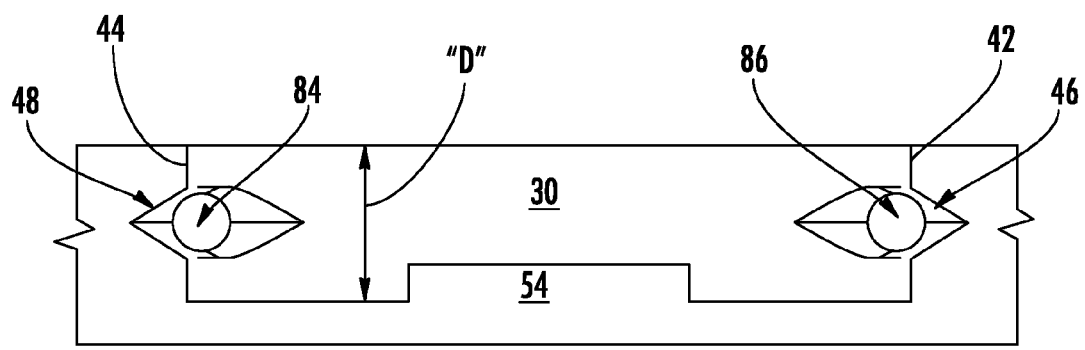
FIG. 8 is a cross-sectional view taken along line 8-8 of FIG. 7 illustrating the contact pad pocket shown in FIG. 7.

Referring to FIGS. 4 and 8, the contact pad pocket 30 may further include opposing undercuts 46 and 48 formed in the sidewalls 42 and 44, respectively, for receiving first and second retaining arms 60 and 62 of retaining spring 32 as further described below. A cylindrical locating post 54 having a diameter and a height configured to be received in the locating cavity 38 of the contact pad 18 may extend upwardly from a bottom surface 55 of the proximal end of the contact pad pocket 30. The locating post 54 may thus be adapted for matingly engaging the locating cavity 38 of the contact pad 18 as further described below.

Figure 6:
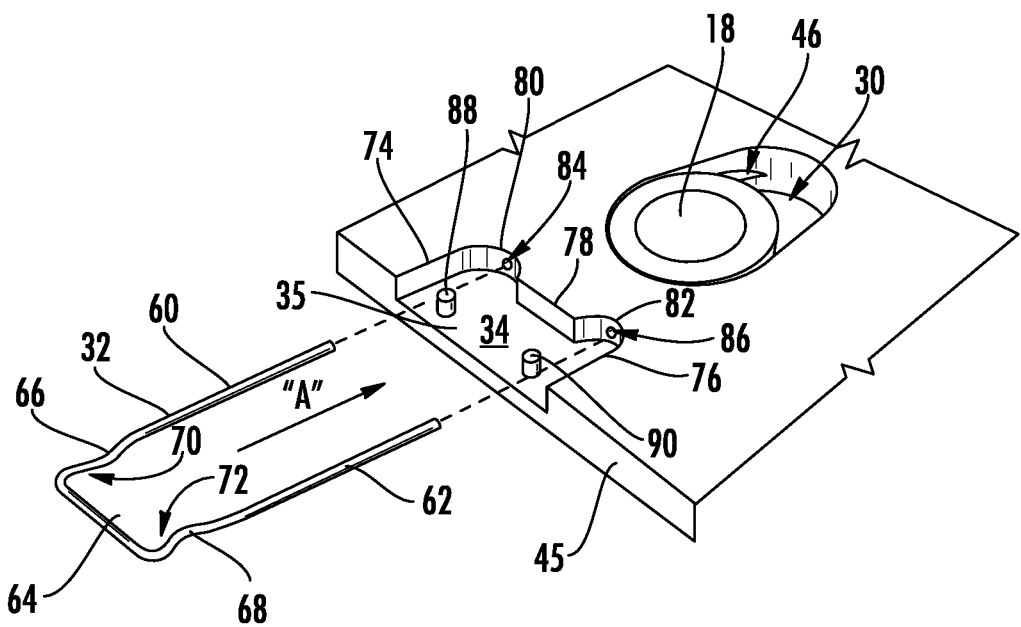
FIG. 6 is a detailed perspective view illustrating installation of the contact pad of FIG. 3 with the end effector shown in FIG. 1, including the retaining spring in an uninstalled position.

When the end effector 10 is fully assembled, the contact pad 18 may be seated within the proximal end of the contact pad pocket 30 (as best shown in FIG. 6), with the locating post 54 of the contact pad pocket 30 extending into the locating cavity 38 of the contact pad 18. The locating post 54 thereby secures the contact pad 18 against lateral movement within the contact pad pocket 30 and further prevents the contact pad 18 from being installed in the contact pad pocket 30 in an upside-down orientation. With the contact pad 18 installed thusly, the sidewall 37 of the contact pad 18 may be disposed in a close clearance relationship with the sidewalls 42 and 44, the retaining channel 36 may be vertically aligned with the undercuts 46 and 48, and the top surface 40 of the contact pad 18 may extend above the top surface of the end effector body portion 12.

The locating cavity 38 and locating post 54 are shown in FIGS. 3 and 4 as being substantially cylindrical in shape, but it is contemplated that the locating cavity 38 and locating post 54 may have any shape or configuration that facilitates mating engagement therebetween for securing the lateral position of the contact pad 18 within the contact pad pocket 30. Furthermore, alternative embodiments of the end effector 10 are contemplated wherein the contact pad 18 may include a plurality of locating cavities 38 and wherein the contact pad pocket 30 may include a plurality of corresponding locating posts 54. Still further, it is contemplated that the locating cavity 38 and locating post 54 may be entirely omitted from the contact pad 18 and contact pad pocket 30, respectively.

Figure 5:
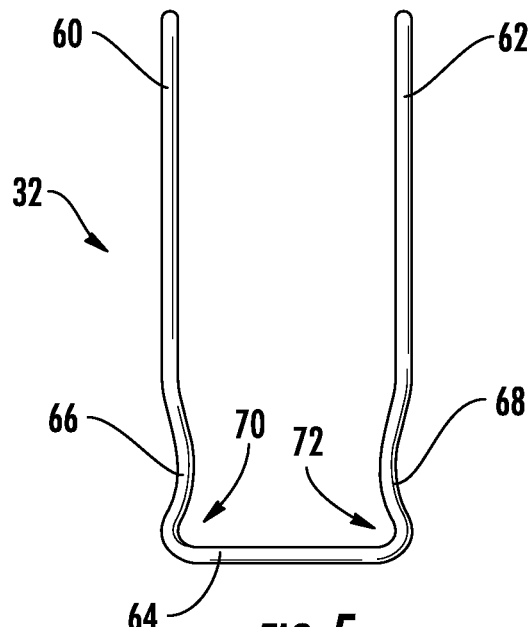
FIG. 5 is a top view illustrating an exemplary retaining spring for use with the end effector shown in FIG. 1.

Referring to FIGS. 5 and 6, the retaining spring 32 may be a substantially U-shaped member having two laterally-spaced, substantially parallel retaining arms 60 and 62 extending from the ends of a cross member 64. The lateral distance between the retaining arms 60 and 62 may be slightly greater than the inner diameter of the annular retaining channel 36 (FIG. 3) of the contact pad 18, and each of the retaining arms 60 and 62 may have a cross-sectional size and shape that allow the retaining arms 60 and 62 to be at least partially received within the retaining channel 36 as further described below. The retaining arms 60 and 62 may include respective, inwardly-curved portions 66 and 68 immediately adjacent the cross member 64 that define respective locking pockets 70 and 72.

The retaining spring 32 may be formed of any material that is suitably resilient and durable and that is also sufficiently flexible for allowing the retaining arms 60 and 62 to be flexed apart (as further described below) upon the application of moderate manual force by a human of average strength. For example, the retaining spring 32 may be formed of various metals, plastics, or composite materials that provide the retaining spring 32 with a suitable, spring-like quality.

Figure 7:
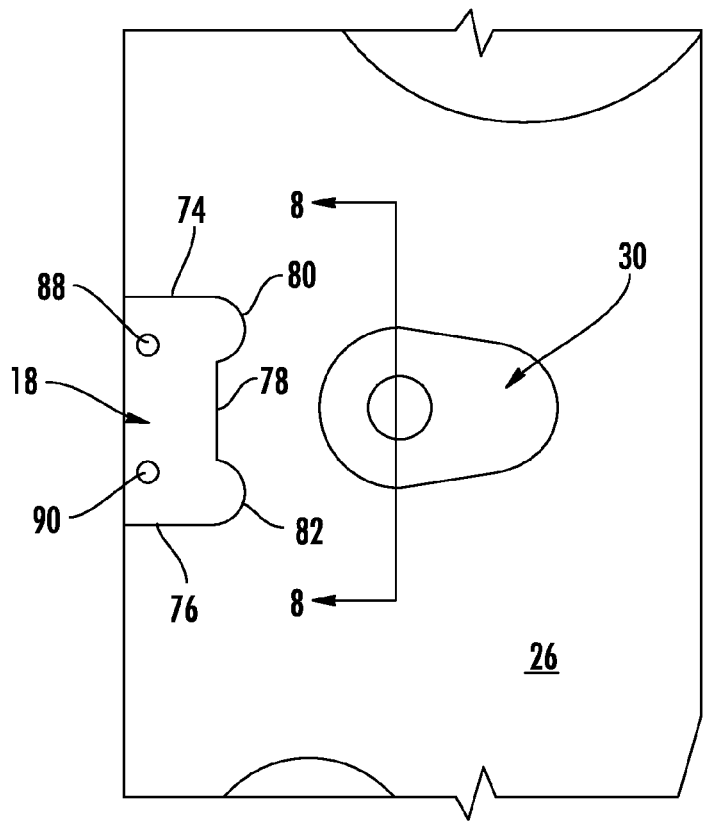
FIG. 7 is a top view illustrating a retaining spring pocket and a contact pad pocket of the end effector shown in FIG. 1.
Figure 9:
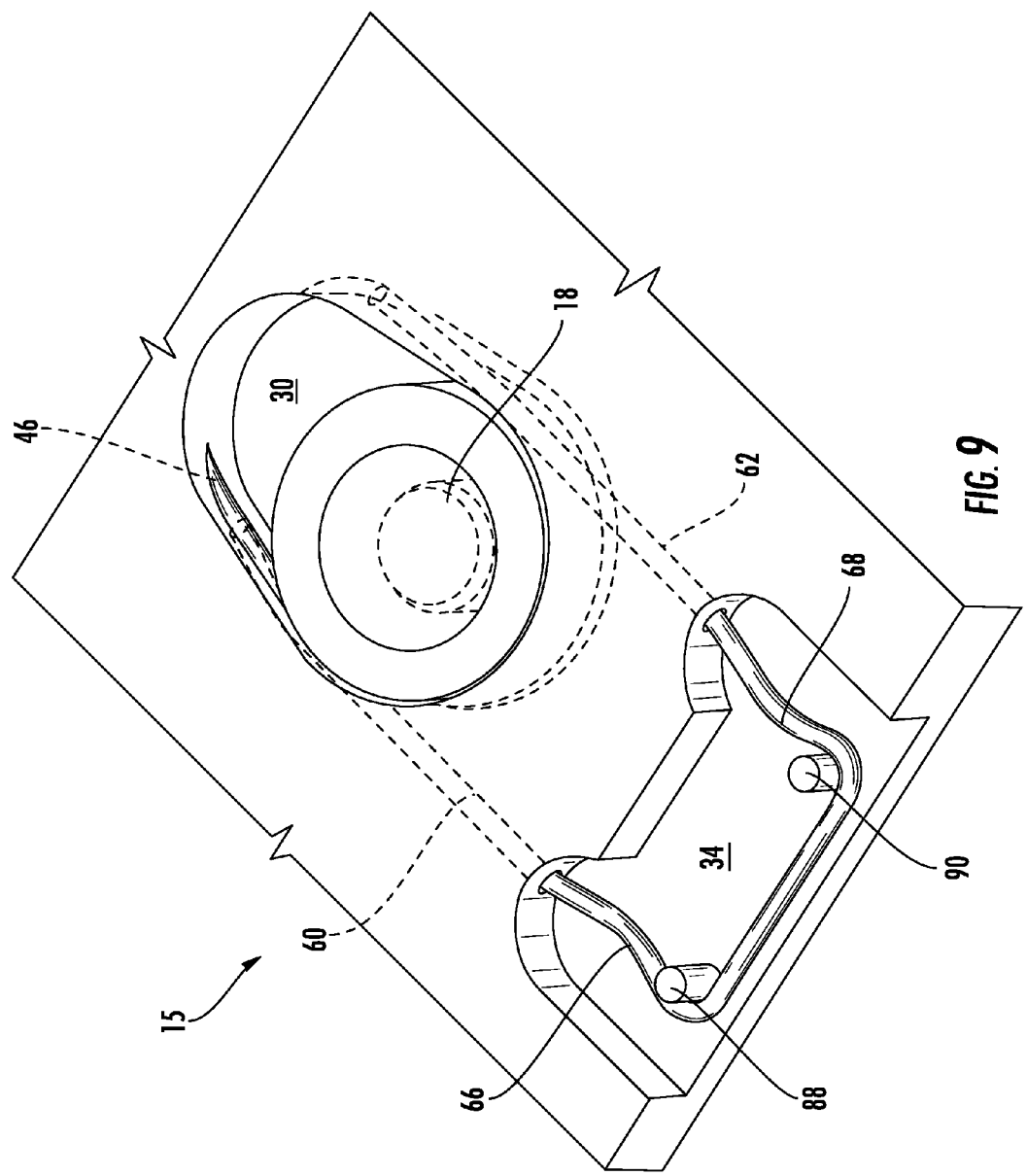
FIG. 9 is a detailed perspective view illustrating a fully assembled contact pad installation in the end effector shown in FIG. 1.

Referring to FIGS. 6 and 7, the spring pocket 34 may be a recess formed in a top surface of the left lift arm 26 and that extends from the outer edge 45 of the left lift arm 26 toward the contact pad pocket 30. The spring pocket 34 may be defined by a pair of opposing sidewalls 74 and 76 and an end wall 78 located adjacent the contact pad pocket 30. The end wall 78 may include a pair of laterally-spaced locating notches 80 and 82 formed therein, the purpose of which will be described below. Through-holes 84 and 86 may extend from respective locating notches 80 and 82 through the end wall 78 to respective undercuts 46 and 48 of the contact pad pocket 30 (as best shown in FIG. 9), thereby forming continuous channels from the spring pocket 34 to the contact pad pocket 30. Each of the through-holes 84 and 86 may have a diameter or cross-sectional size and shape that are adapted to axially receive a respective one of the retaining arms 60 and 62 in a close clearance relationship therewith as further described below.

Laterally-spaced locking posts 88 and 90 may extend upwardly from a bottom surface 35 of the spring pocket 34, adjacent the outer edge of the left lift arm 26. The locking posts 88 and 90 may be sized and shaped to interact with respective locking pockets 70 and 72 of the retaining spring 32. In an embodiment, the locking posts 88 and 90 may be spaced apart by an amount roughly equal to the lateral distance between the locking pockets 70 and 72.

The locking posts 88 and 90 are shown in the figures as having a circular-cylindrical shape, and the locking pockets 70 and 72 are shown as having rounded counters, but this is not critical. The shapes of the locking posts 88 and 90 and locking pockets 70 and 72 may be varied as long as the locking posts 88 and 90 can be received and retained within the locking pockets 70 and 72 as further described below. For example, the locking posts 88 and 90 may have a square shape and the locking pockets 70 and 72 may alternatively have corresponding square contours.

Referring to FIGS. 6 and 9, the retaining arms 60 and 62 of the retaining spring 32 may be inserted into the respective through-holes 84 and 86 and the retaining spring 32 may be manually pushed in the direction of arrow "A" into the spring pocket 34. If, upon an attempt to insert the retaining arms 60 and 62 into the through-holes 84 and 86, the tips of the retaining arms 60 and 62 are not initially aligned with the through-holes 84 and 86 sufficiently to allow such insertion, the contours of the end wall 78 that define the locating notches 80 and 82 may provide assistance by guiding the tips of the retaining arms 60 and 62 into the respective through-holes 84 and 86. It will therefore be appreciated that the locating notches 80 and 82 may be formed with any type of tapered or converging shape or configuration, such as a V-shape or a cone shape, which is suitable for providing such a guiding function.

As the retaining spring 32 is slid into the spring pocket 34, the inwardly-curved portions 66 and 68 of the retaining arms 60 and 62 may be brought into engagement with the locking posts 88 and 90. Upon the application of sufficient manual force upon the retaining spring 32 in the direction of insertion (i.e., arrow "A" in FIG. 6), the inwardly-curved portions 66 and 68 of the spring may be caused to flex outwardly around the locking posts 88 and 90 as they pass the posts. Once the portions 66, 68 pass the posts 88, 90, they may flex back inward, locking the spring within the spring pocket 34 to assume the assembled position shown in FIG. 9. The retaining spring 32 is thus secured further movement absent the application additional manual force.

With the retaining spring 32 installed in the manner described above, the retaining arms 60 and 62 extend into the converging undercuts 46 and 48 of the tapered contact pad pocket 30 (see FIG. 8). The inter-engagement between the undercuts 46, 48 and the retaining arms 60 and 62 forces the arms laterally-inwardly toward one another so that they engage the retaining channel 36 (FIG. 3) of the contact pad 18. The engagement between the retaining arms 60 and 62 and the retaining channel 36 thus locks the contact pad 18 vertically with respect to the contact pad pocket 30. As described above, the contact pad 18 can also be secured against lateral movement by mating engagement between the locating cavity 38 and locating post 64 (see FIGS. 3 and 4).

Since the retaining spring 32 is flexible, the contact pad 18 and end effector body portion 12 are able to expand and contract relative to one another, such as may occur during thermal cycling, with the retaining arms 60 and 62 flexing outwardly and inwardly to accommodate such expansion and contraction without the contact pad's attachment to the end effector body portion 12 becoming loose and without causing damage to the contact pad 18 or to the end effector body portion 12.

In addition, the disclosed arrangement ensures that any particulate matter that may be produced by engagement between the contact pad 18 and substrates, or by frictional engagement between the contact pad 18 and the retaining spring 32 that may result from acceleration and/or thermal expansion forces, may fall into the contact pad pocket 30 where it may be collected and removed. This prevents the particulate from raining down on other substrates or other surfaces in the associated load lock.

To replace the contact pad 18, such as may be desired where the contact pad 18 is damaged, becomes excessively worn, or is excessively contaminated, the retaining spring 32 may be manually withdrawn (e.g., pulled in the opposite direction of arrow "A" in FIG. 6) from the retaining spring pocket 34 and the contact pad 18 may be removed from the contact pad pocket 30. A new contact pad may then be placed in the contact pad pocket 30 and the retaining spring 32 may be reinserted into the retaining spring pocket 30 in the manner described above.

The composite end effector 10 of the present disclosure thus provides a convenient arrangement for securely and removably attaching material-contacting portions of the end effector 10 to a non-material-contacting portion of the end effector 10. The disclosed arrangement also permits relative thermal expansion and contraction of the material-contacting portions and non-material-contacting portion without the pad becoming loose or damaging the end effector 10 and/or a carried substrate. In addition, the composite end effector 10 of the present disclosure can mitigate the dispersion of particulate matter generated during substrate transfer and processing operations.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. An end effector comprising:
a body portion;
a contact pad pocket formed in the body portion;
a spring pocket formed in the body portion adjacent the contact pad pocket, the spring pocket and the contact pad pocket separated by an end wall;
a pair of through-holes extending from the spring pocket to the contact pad pocket through the end wall;
a contact pad positionable within the contact pad pocket, the contact pad having at least one retaining channel formed therein; and
a retaining spring having a pair of retaining arms extendable from the spring pocket through the through-holes and into the contact pad pocket, wherein the retaining arms have lengths sufficient to extend at least partially into the at least one retaining channel of the contact pad when the contact pad is positioned in the contact pad pocket to restrict movement of the contact pad.

2. The end effector of claim 1, wherein the contact pad has a cylindrical shape and the retaining channel is an annular channel formed in a sidewall of the contact pad.

3. The end effector of claim 1, further comprising a locating cavity formed in a lower surface of the contact pad and a locating post extending from the contact pad pocket, wherein the locating post is receivable within the locating cavity for restricting lateral movement of the contact pad.

4. The end effector of claim 1, wherein the contact pad has a convex upper surface for engaging a substrate therewith.

5. The end effector of claim 1, wherein the contact pad pocket is defined by a pair of opposing sidewalls that converge as they extend away from the end wall.

6. The end effector of claim 5, wherein each of the sidewalls has an undercut formed therein for receiving a respective one of the retaining arms.

7. The end effector of claim 5, wherein when the retaining arms are extended from the spring pocket through the through-holes and into the contact pad pocket the converging sidewalls force the retaining arms toward one another and into the at least one retaining channel of the contact pad.

8. The end effector of claim 1, further comprising a pair of laterally-spaced locking posts extending from the spring pocket and a pair of laterally-spaced locking pockets formed in the retaining spring, wherein the locking posts are receivable within the locking pockets for restricting movement of the retaining spring.

9. The end effector of claim 1, further comprising a pair of laterally-spaced locating notches formed in the rear wall, each locating notch adapted to receive a tip of a respective one of the retaining arms and guide the tip into a respective one of the through-holes.

10. The end effector of claim 1, wherein the retaining spring is U-shaped.

11. An end effector comprising:
a body portion;
a plurality of contact pad pockets formed in the body portion;
a plurality of spring pockets formed in the body portion adjacent respective ones of said plurality of contact pad pockets, the plurality of spring pockets and the plurality of contact pad pockets separated by respective end walls;
a pair of through-holes extending from each of said spring pockets to the associated one of said contact pad pockets through the end wall;
a plurality of contact pads, each of said plurality of contact pads disposed within a respective one of said plurality of contact pad pockets, the plurality of contact pads each having at least one retaining channel formed therein; and
a plurality of retaining springs each having a pair of retaining arms extending from a respective one of said plurality of spring pockets through associated ones of said through-holes and into the respective contact pad pocket, wherein the retaining arms of each of said plurality of retaining springs extend at least partially into the at least one respective retaining channel of the associated contact pad to restrict movement of the associated contact pad.

12. The end effector of claim 11, wherein at least one of said plurality of contact pads has a circular cross section and the retaining channel of the contact pad is an annular channel formed in a sidewall of the contact pad.

13. The end effector of claim 11, further comprising a locating cavity formed in a bottom surface of at least one of said plurality of contact pads and a locating post extending from the body portion and matingly engaging the locating cavity for restricting movement of the contact pad.

14. The end effector of claim 11, wherein at least one of said plurality of contact pads has a surface projecting beyond a surface of the body portion for engaging a substrate therewith.

15. The end effector of claim 11, wherein at least one of said contact pad pockets tapers as it extends away from the respective end wall.

16. The end effector of claim 15, wherein said at least one contact pad pocket is defined by a pair of converging sidewalls, each sidewall having an undercut formed therein, wherein each of the retaining arms of the respective retaining spring extend into a respective one of the undercuts.

17. The end effector of claim 16, wherein the converging sidewalls of said at least one contact pad pocket force the retaining arms of the respective retaining spring toward one another and into the at least one retaining channel of the associated contact pad.

18. The end effector of claim 11, further comprising a pair of laterally-spaced locking posts extending from the body portion and a pair of laterally-spaced locking pockets formed in at least one of said plurality of retaining springs, wherein the locking posts are disposed within the locking pockets and restrict movement of said at least one retaining spring.

19. The end effector of claim 11, further comprising a pair of laterally-spaced locating notches formed in at least one of said respective end walls, each locating notch defining a tapered passageway leading from the respective spring pocket into a respective through-hole in the end wall.

20. The end effector of claim 11, wherein the retaining arms of at least one of said plurality of retaining springs extends from the ends of a perpendicular cross member.

\* \* \* \* \*